United States Patent
Gao et al.

(10) Patent No.: US 8,395,427 B1
(45) Date of Patent: Mar. 12, 2013

(54) LOW POWER AND LOW SPUR SAMPLING PLL

(75) Inventors: Xiang Gao, San Jose, CA (US); Ahmad Bahai, Lafayette, CA (US); Mounir Bohsali, Danville, CA (US); Ali Djabbari, Saratoga, CA (US); Eric Klumperink, Lichtenvoorde (NL); Bram Nauta, Enschede (NL); Gerard Socci, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 195 days.

(21) Appl. No.: 12/973,323

(22) Filed: Dec. 20, 2010

(51) Int. Cl.
*H03L 7/06* (2006.01)
(52) U.S. Cl. .................. 327/156; 327/147
(58) Field of Classification Search ............ 327/147, 327/156
See application file for complete search history.

(56) References Cited

U.S. PATENT DOCUMENTS

| | | | |
|---|---|---|---|
| 6,055,286 A | 4/2000 | Wu et al. | |
| 6,081,572 A | 6/2000 | Filip | |
| 7,737,743 B1 * | 6/2010 | Gao et al. | 327/158 |
| 7,990,194 B2 * | 8/2011 | Shim | 327/158 |
| 8,253,455 B2 * | 8/2012 | Hyun et al. | 327/147 |
| 2008/0218274 A1 * | 9/2008 | Clementi | 331/16 |
| 2012/0154003 A1 * | 6/2012 | Gao et al. | 327/159 |

OTHER PUBLICATIONS

Anand et al., "A CMOS Clock Recovery Circuit for 2.5-Gb/s NRZ Data" IEEE Journal of Solid-State Circuits, vol. 36, No. 3, Mar. 2001, pp. 432-439.
Maulik et al., "A 150 MHz-400MHz DLL-Based Programmable Clock Multiplier with -70dBc Reference Spur in 0.18um CMOS", IEEE 2006, CICC, pp. 757-760.
Desgrez et al., "A New MMIC Sampling Phase Detector Design for Space Applications", IEEE Journal of Solid State-Circuits, vol. 38, No. 9, Sep. 2003, pp. 1438-1442.
Gao et al., "A 2.2GHz 7.6mW Sub-Sampling PLL with -126dBc/Hz In-band Phase Noise and 0.15ps RMS Jitter in 0.18um CMOS",IEEE Int. Solid-State Circuits Conf.(ISSCC), pp. 392-393, IEEE 2009.
Gao et al., "Sampling Phase Dectector and Charge Pump with Pulse Width Control", US Patent pending, filed as IDF P07120 in Mar. 2008.
Gao et al., "Spur Reduction Technique for Sampling PLLs", summary of invention submitted Mar. 2009.
U.S. Appl. No. 12/973,353 for Spur Reduction Technique for Sampling PLL'S, 16 pages.

* cited by examiner

*Primary Examiner* — Adam Houston
(74) *Attorney, Agent, or Firm* — Andrew S. Viger; Wade J. Brady, III; Frederick J. Telecky, Jr.

(57) ABSTRACT

Control circuitry and method of controlling for a sampling phase lock loop (PLL). By controlling the duty cycle of one or more sampling control signals, power consumption by the reference signal buffer and spurious output signals from the sampling PLL being controlled can be reduced.

19 Claims, 6 Drawing Sheets

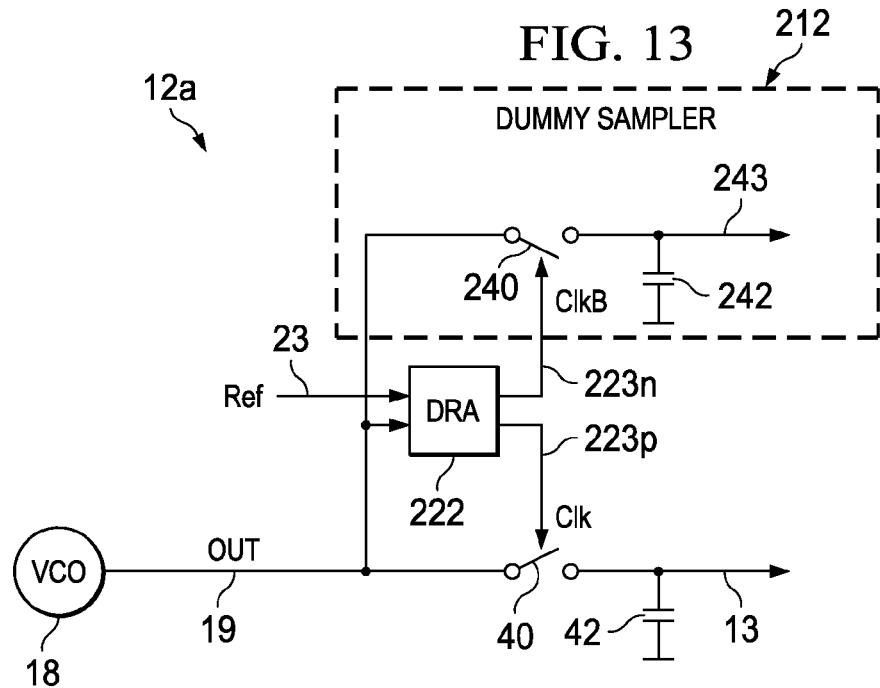
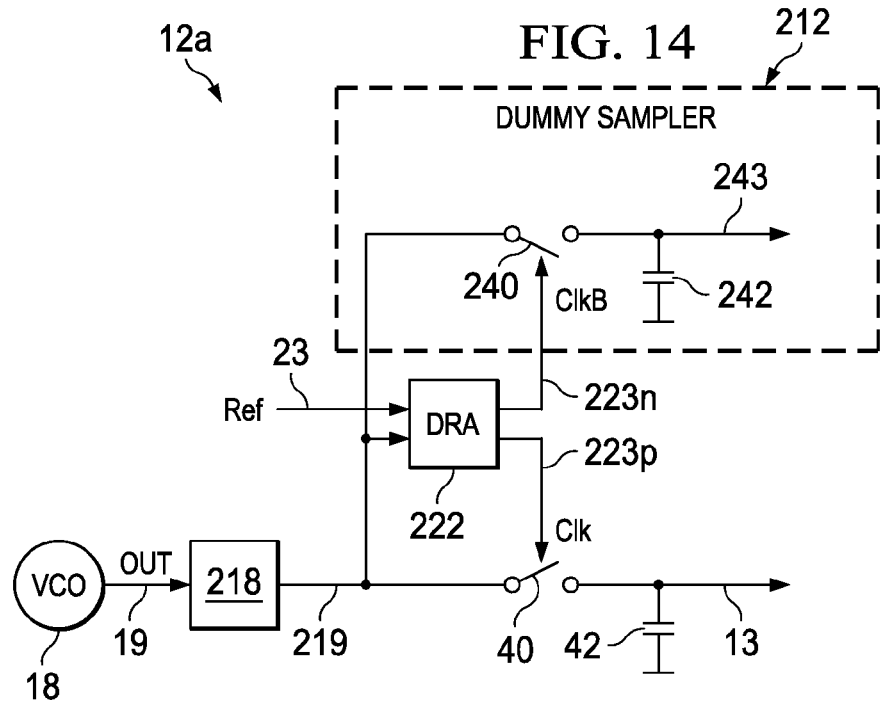

LOW POWER AND LOW SPUR SAMPLING PLL

BACKGROUND

1. Field of the Invention

The present invention relates to sampling phase lock loops, in a particular, to control circuitry for sampling phase lock loops for reducing power consumption and spurious output signals.

2. Related Art

Referring to FIG. 1, a conventional phase lock loop (PLL) 10 includes a sampling phase detector 12, followed by a charge pump 14, a low pass filter 16 and a controllable signal source 18, typically a voltage controlled oscillator (VCO). An external reference signal source 20, often in the form of a crystal oscillator, provides a reference signal 21 which is buffered by a buffer amplifier 22 to convert the sine wave input signal 21 to a square wave reference signal 23. In accordance with this buffered reference signal 23, the sampling phase detector 12 samples the VCO output signal 19. The sampled signal 13 drives the charge pump 14, the output of which is filtered by the low pass filter 16 to produce the DC control signal 17 for the VCO 18.

Referring to FIG. 2, the reference buffer circuit 22 is often implemented as an inverter circuit 22a (or multiple such inverters 22a connected in series). In accordance with well known principles, during positive extremes of the input signal 21, the NMOS transistor 30n is turned on and the PMOS transistor 30p is turned off. Conversely, during negative extremes of the input signal, the PMOS transistor 30p is turned on and the NMOS transistor 30n is turned off. This produces the output square wave signal 23 having negative and positive signal excursions, respectively. However, between such positive and negative signal extremes, both transistors 30p, 30n will be conductive.

Referring to FIG. 3, this implementation 22a of the buffer circuitry 22 draws a significant amount of current from the power supply VDD. In order to achieve low PLL output signal 19 jitter, large transistor sizes are required for low reference clock signal noise. Accordingly, the large transistors 30p, 30n required for the inverting buffer circuit 22a can dominate the power consumption of the overall sampling PLL circuitry. As seen in the Figure, when the input sine wave voltage 21 is higher than the NMOS transistor 30n threshold voltage $V_{th,N}$, the NMOS transistor 30n is conducting. When the input voltage 21 is lower than the power supply voltage VDD minus the PMOS transistor 30p threshold voltage VDD-$V_{th,P}$, the PMOS transistor 30p is conducting. Since the power supply voltage VDD is typically larger than the sum of the threshold voltages, there will be a time interval when both the NMOS 30n and PMOS 30p transistors are conducting. This results in a direct path current that flows from the power supply VDD to circuit ground GND. This direct path current is not fundamentally required for a circuit operation, and is, therefore, a waste of power. In some cases such direct path current can account for more than 90% of the total power for the inverter circuit 22a.

Referring to FIG. 4, the sampling circuitry 12 (FIG. 1) is typically implemented as a sampler circuit 12a having a series switch 40 and shunt capacitance 42. The switch 40 is opened and closed in accordance with the mutually opposed signal states of the square wave reference signal 23. This produces the sampled voltage 13 which is stored on the shunt capacitance 42 during the time intervals that the switch 40 is opened.

Referring to FIG. 5, the switching activity of such a sampler 12a tends to disturb operation of the VCO 18, thereby producing spurious output signals within the VCO output signal 19.

Referring to FIG. 6, in accordance with well known principles, differential circuitry can also be used as part of the PLL circuit 10. In such an implementation, the VCO 18d produces a differential output signal having mutually opposed positive 19p and negative 19n signal phases which are separately sampled by switches 40p, 40n controlled by the preferred reference signal 23, and stored on sampling capacitances 42p, 42n to produce positive 13p and negative 13n phases of a differential sampled signal voltage.

As noted above, the switch 40 (FIG. 4) is closed when the reference signal 23 is asserted (e.g., high) and open when the reference signal 23 is de-asserted (e.g., low). The sampling edge 23s is aligned in phase to a rising edge of the output signal 19. When the switch 40 is turned off, the sampled output voltage 13 is well defined and equal to the DC component of the VCO output voltage 19. This also means that when the switch 40 is turned on again the voltage 13 on the sampling capacitance 42 will be equal to this DC voltage component. However, the VCO voltage 19 at the moment that the switch 40 is turned on may not be equal to its DC component. This results in charge sharing between the output of the VCO 18 and the capacitance 42 in the sampler 12a.

In other words, the switching activity of the sampler 12a periodically changes the loading of the output of the VCO 18. During the on time of the switch 40, the VCO output is loaded by the sampling capacitance 42, while during the off time of the switch 40, the VCO is disconnected and not loaded by the sampling capacitance 42. This change in loading produces changes in the frequency of the VCO output signal 19. The switch 40 is often implemented with a MOS transistor operating in its triode region. When the transistor is turned on or off, the channel charge within the MOS transistor is built or released and absorbed from or injected into, respectively, the output of the VCO 18. This results in spurious output signals being generated within the VCO output signal 19. In radio receiver applications, such spurious signals mixes undesirably in the channel bandwidth, thereby degrading the signal-to-noise ratio (SNR), and in clock data recovery applications, such spurious signals translate to peak-to-peak jitter, thereby increasing the bit error rate (BER).

Accordingly, it would be desirable to provide better control of a sampling PLL such that power supply consumption is reduced and spurious output signals are minimized.

BRIEF DESCRIPTION OF THE DRAWINGS

FIG. 13 is a schematic diagram of sampling control circuitry in accordance with another exemplary embodiment.

FIG. 14 is a schematic diagram of sampling control circuitry in accordance with another exemplary embodiment.

DETAILED DESCRIPTION

Figure 1:
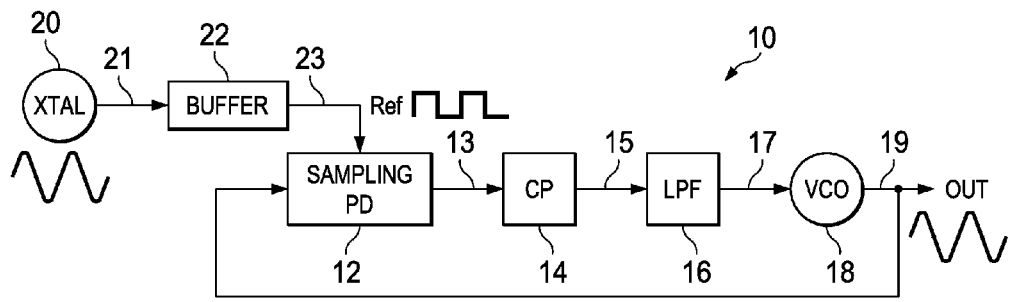
FIG. 1 is a functional block diagram of a conventional sampling PLL with its input reference buffer circuitry.
Figure 2:
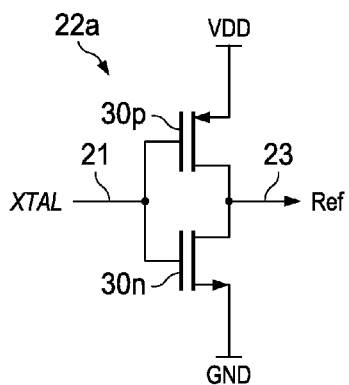
FIG. 2 is a schematic diagram of a conventional inverting reference buffer circuit.
Figure 3:
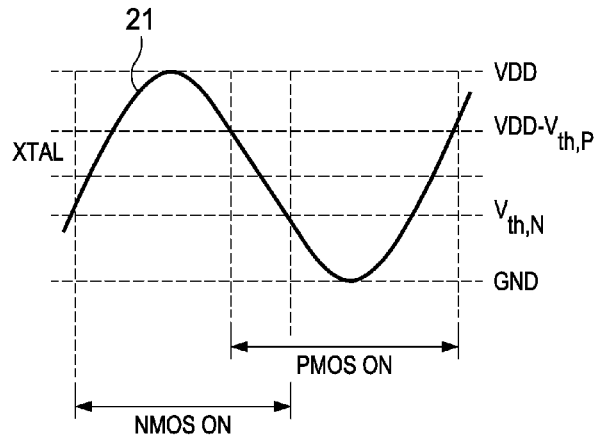
FIG. 3 is a signal timing diagram for the operation of the circuit of FIG. 2.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. To the extent that the figures illustrate diagrams of the functional blocks of various embodiments, the functional blocks are not necessarily indicative of the division between hardware circuitry.

In accordance with the presently claimed invention, control circuitry and a method for controlling a sampling phase lock loop (PLL) are provided. By controlling the duty cycle of one or more sampling control signals, power consumption by the reference signal buffer and spurious output signals from the sampling PLL being controlled can be reduced.

In accordance with one embodiment of the presently claimed invention, control circuitry for a sampling phase lock loop (PLL) includes:

buffer circuitry responsive to a reference signal and a duty cycle control signal by providing first and second sampling control signals having first and second duty cycles, respectively, at least one of which is controlled; and signal sampling circuitry responsive to the first sampling control signal and a PLL output signal from a sampling PLL by providing the duty cycle control signal;

wherein the PLL output signal has a PLL signal frequency and a corresponding PLL signal period, the PLL signal frequency is related to the second duty cycle, and the second sampling control signal is an inverse of the first sampling control signal.

In accordance with another embodiment of the presently claimed invention, a computer readable medium includes a plurality of executable instructions that, when executed by an integrated circuit design system, cause the integrated circuit design system to produce an integrated circuit (IC) that includes:

buffer circuitry responsive to a reference signal and a duty cycle control signal by providing first and second sampling control signals having first and second duty cycles, respectively, at least one of which is controlled; and signal sampling circuitry responsive to the first sampling control signal and a PLL output signal from a sampling PLL by providing the duty cycle control signal;

wherein the PLL output signal has a PLL signal frequency and a corresponding PLL signal period, the PLL signal frequency is related to the second duty cycle, and the second sampling control signal is an inverse of the first sampling control signal.

In accordance with still another embodiment of the presently claimed invention, a method of controlling a sampling phase lock loop (PLL) includes:

buffering, in accordance with a duty cycle control signal, a reference signal to provide first and second sampling control signals having first and second duty cycles, respectively, at least one of which is controlled; and sampling, in accordance with the first sampling control signal, a PLL output signal from a sampling PLL by providing the duty cycle control signal;

wherein the PLL output signal has a PLL signal frequency and a corresponding PLL signal period, the PLL signal frequency is related to the second duty cycle, and the second sampling control signal is an inverse of the first sampling control signal.

Figure 4:
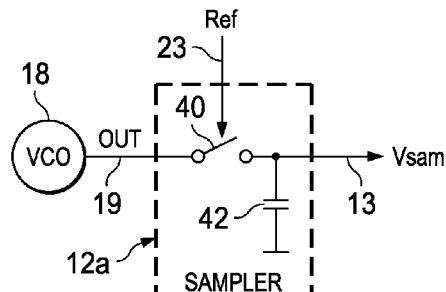
FIG. 4 is a schematic diagram of a conventional sampling circuit.
Figure 5:
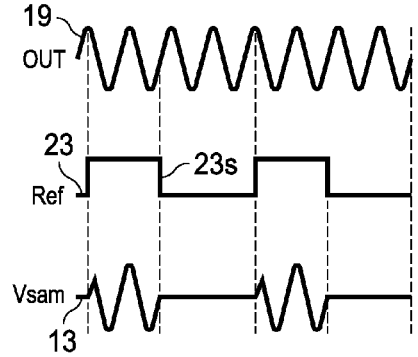
FIG. 5 is a signal timing diagram for the circuitry of FIG. 4.
Figure 6:
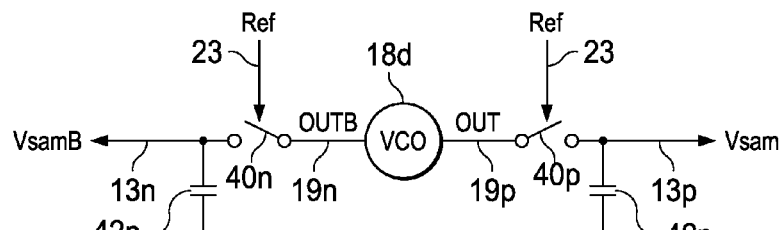
FIG. 6 is a schematic diagram of a differential embodiment of the sampler circuitry of FIG. 4.
Figure 7:
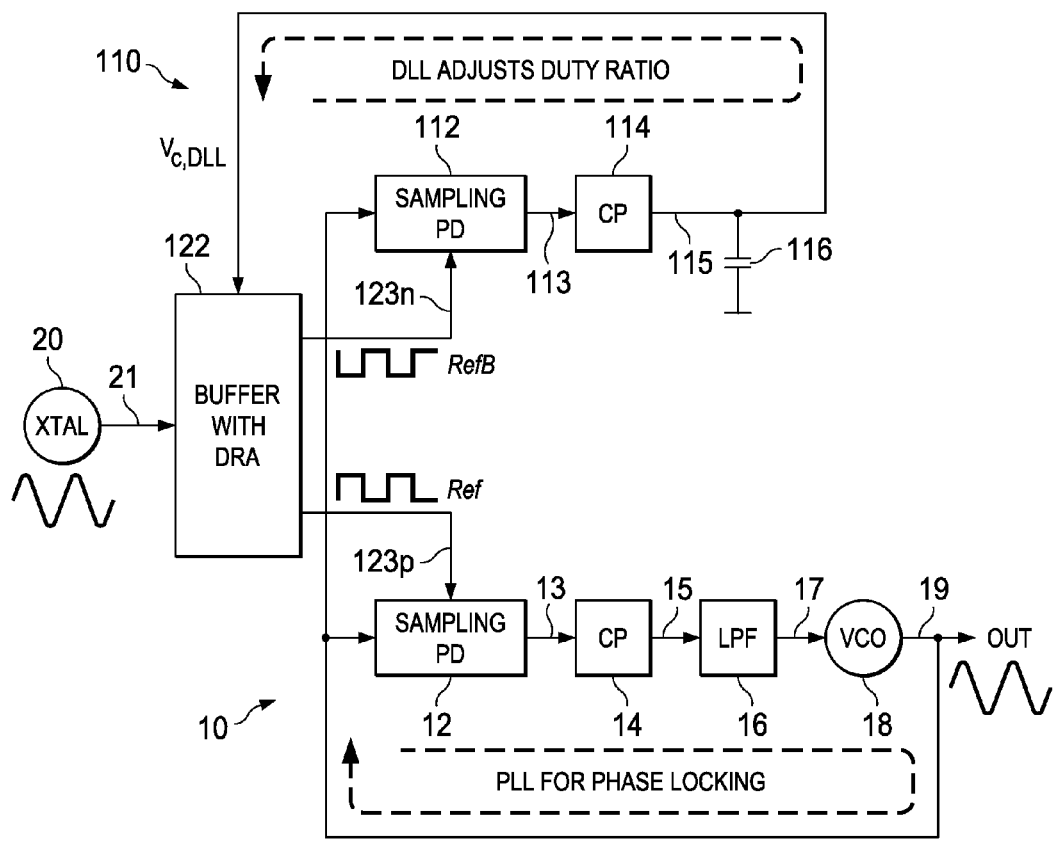
FIG. 7 is a functional block diagram of a sampling PLL driven by reference buffer circuitry in accordance with an exemplary embodiment.

Referring to FIG. 7, in accordance with an exemplary embodiment, the sampling PLL 10 is driven by a buffered reference signal 123$p$ generated by buffer circuitry 122 including duty ratio adjustment (DRA) circuitry (discussed in more detail below), which, in turn, is controlled by a delay locked loop (DLL) 110. The DLL 110 includes a sampling phase detector 112 (e.g., a sampler 12$a$ as depicted in FIG. 4), a charge pump 114 and low pass filter 116, similar to the sampling PLL 10. The filtered voltage 115 serves as the control signal for the buffer circuitry 122.

Figure 8:
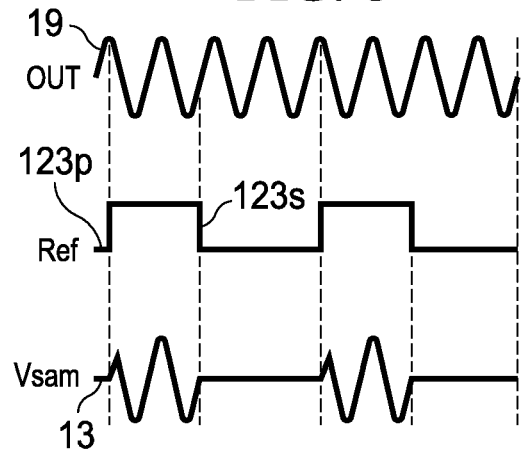
FIG. 8 is a signal timing diagram of the operation of a sampling circuit using a reference signal in accordance with an exemplary embodiment.

Referring to FIG. 8, as discussed in more detail below, the buffer circuitry 122 produces the reference signal 123$p$ for the sampling PLL 10 and a related reference signal 123$n$ for the DLL 110 such that the sampling duration, e.g., the duration of the asserted state of the reference signal 123$p$, is an integer multiple of the period of the VCO output signal 19. Accordingly, the instantaneous DC voltage component of the VCO output signal 19 is the same as the reference signal 123$p$ transitions between its mutually opposed asserted and deasserted signal states. As a result, charge sharing between the sampling capacitance 42 (FIG. 4) and the output stage of the VCO 18 is minimized, if not eliminated entirely.

Figure 9:
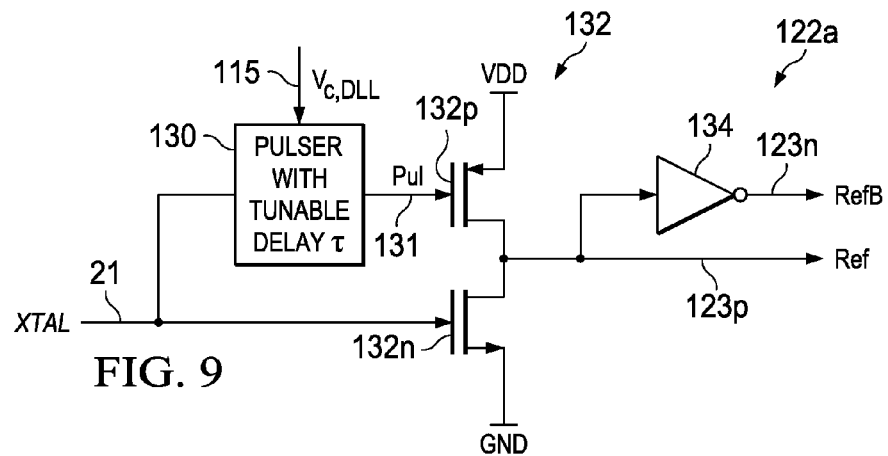
FIG. 9 is a schematic diagram of an exemplary embodiment of the buffer circuitry of FIG. 7.

Referring to FIG. 9, an exemplary embodiment 122$a$ of the buffer circuitry 122 includes pulser circuitry 130, an inverting buffer 132 implemented with PMOS 132$p$ and NMOS 132$n$ transistors, and logic inverter circuitry 134. The pulser circuitry 130 has a tunable delay which is controlled by the output signal 115 of the DLL 110. The resulting signal pulse 131 drives the PMOS transistor 132p of the inverting buffer 132, while the original reference signal 21 drives the NMOS transistor 132n. The output of the inverting buffer circuitry 132 serves as the sampling control signal 123p for the sampling PLL 10, while its inverse serves as the sampling control signal 123n for the DLL 110.

Figure 10:
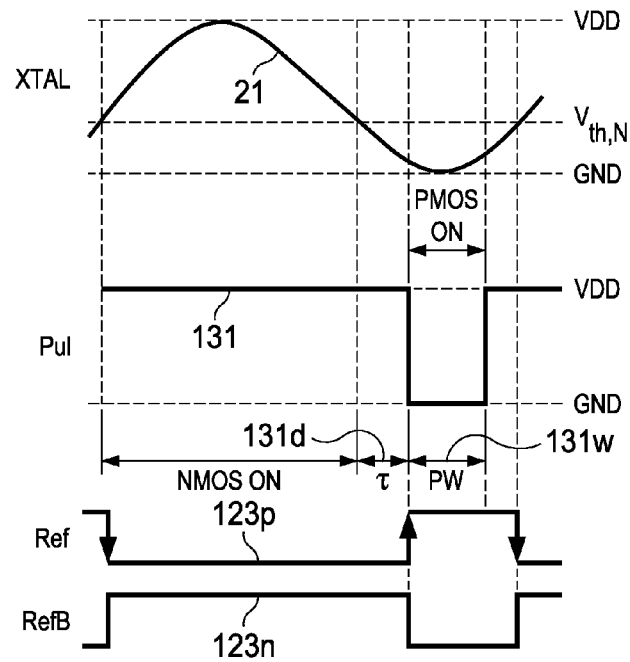
FIG. 10 is a signal timing diagram for the circuitry of FIG. 9.

Referring to FIG. 10, as a result, the sampling PLL control signal 123p and DLL control signal 123n ensure that the duty ratio of such signals 123p, 123n is such that the duration of the assertion state of the sampling PLL control signal 123p is in integer multiple of the period of the VCO output signal 19 (FIG. 8). When phase lock is achieved, the sampling PLL 10 aligns a rising edge of the VCO output signal 19 with its sampling edge 123s, while the DLL 110 aligns its sampling edge, i.e., the falling edge of its control signal 123n, with another rising edge of the VCO output signal 19. Since these control signals 123p, 123n are complementary, the DLL 110 also aligns the rising edge of the sampling PLL control signal 123p with the rising edge of the VCO output signal 19. As a result, both the rising and falling edges of the sampling PLL control signal 123p are phased aligned to a rising edge of the VCO output signal 19. This ensures that the switch on-time (duration of assertion) of the sampling PLL control signal 123p (and similarly the DLL sampling control signal 123n) is defined to be an integer multiple of the period of the VCO output signal 19.

As will be readily appreciated, the additional delay of the inverter circuitry 134 can be compensated in the signal path for the sampling PLL control signal 123p by adding a transmission gate in series (not shown). Since the DLL 110 controls the rising edge of the sampling PLL control signal 123p, which is not the sampling edge, the DLL 110 will not add noise nor disturb the operation of the sampling PLL 110.

By adding the DLL 110, the capacitance loading the VCO 18 is kept constant over time. The sampling phase detectors 12, 112 should be substantially the same. With complementary sampling control signals 123p, 123n, the sampling operations of the sampling phase detectors 12, 112 are mutually exclusive, i.e., when one sampling phase detector is on, the other sampling phase detector is off. As a result, the VCO 18 is always loaded by one sampling phase detector, and such loading does not change with switching. Further, any charge injection from the switch in one sampling phase detector will be largely absorbed by the switched capacitance in the other sampling phase detector, and will cause minimal disturbance to operation of the VCO 18.

Referring to FIG. 10, the direct path current conduction through the inverting buffer circuit 132 can be minimized by a proper choice of the timing within the pulser circuit 130. When the incoming reference signal 21 is higher than the NMOS transistor 132n threshold voltage, the NMOS transistor is turned on. When the pulser output signal 131 is lower than the difference between the power supply voltage VDD and the PMOS transistor 132p threshold voltage, the PMOS transistor 132p is turned on. By an appropriate choice of the pulser delay 131d and the pulse with 131w, it can be ensured that the conduction, or turned on, times of the NMOS 132n and PMOS 132p transistors are mutually exclusive, i.e., non-overlapping. This eliminates direct path current conduction through the inverting buffer circuitry 132, thereby significantly reducing power consumption of the buffer circuitry 132.

Figure 11:
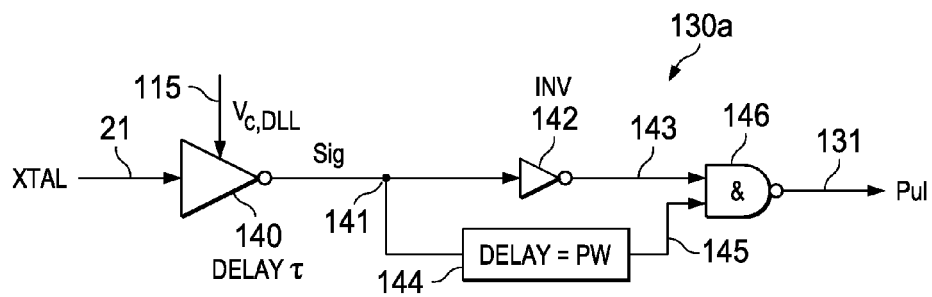
FIG. 11 is a schematic diagram of an exemplary embodiment of the pulser circuitry of FIG. 9.

Referring to FIG. 11, an exemplary embodiment 130a of the pulser circuitry 130 includes inverter circuitry 140 with a controllable delay in accordance with the DLL output signal 115, additional inverter circuitry 142, additional delay circuitry 144 and signal combining circuitry 146 in the form of a logical NAND gate. The delay of the input inverter circuitry 140 can be tuned using well-known techniques, such as adding tunable shunt capacitances to the output circuitry of the inverter 140, or tuning charging or discharging current within the inverter circuitry 140. This controllable delayed signal 141 is inverted by the second inverter circuitry 142 and delayed by the second delay circuitry 144, with the resulting inverted 143 and delayed 145 signals being combined by the logic gate 146 to produce the pulsed signal 131.

Figure 12:
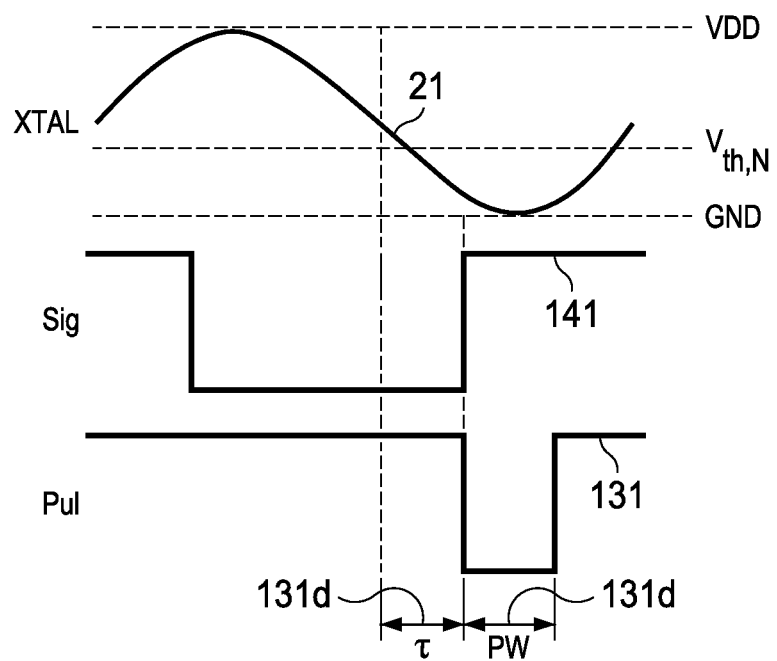
FIG. 12 is a signal timing diagram for the circuitry of FIG. 11.

Referring to FIG. 12, such operation of this circuitry 130a produces the pulsed signal 131 with the delay 131d and pulse width 131w as discussed above.

Referring to FIG. 13, in accordance with another exemplary embodiment, control circuitry for the sampling PLL 10 includes sampling control circuitry in the form of duty ratio adjustment (DRA) circuitry 222. This control circuitry 222 (discussed in more detail below) processes the buffered reference signal 23 and VCO output signal 19 to produce the sampling control signal 223p for controlling the samplings switch 40 such that the duration of the asserted state of this control signal 223p is equal to an integer multiple of the period of the VCO output signal 19, as discussed above with reference to FIG. 8.

As a further alternative embodiment, a dummy sampler circuit 212 can be included which receives a switch control signal 223n from the sampling control circuitry 222 to control a sampling switch 240 for also sampling the VCO output signal 19. This switch control signal 223n is complementary to the switch control signal 223p for the sampler 12a. By the including the dummer sampler 212, which is driven by a sampling control signal 223n complementary to the sampling control signal 223p of the sampling PLL10, the VCO 18 will always be loaded by one sampler 12a, 212 since one switch is always on while another switch is always off, similar to the discussion above for the complementary sampling phase detectors 12, 112 of FIG. 7.

Referring to FIG. 14, in a further alternative embodiment, a series resistance 218 can be included at the output of the VCO 18. Such resistance 218 helps compensate for the difference in the on-resistances of the switches 40, 240, which can affect the loading of the VCO 18 as much as the charging and discharging of the sampling capacitances 42, 242 through the switches 40, 240. As is well known, the transient behavior of the charging and discharging is governed by the RC time constant, and MOS transistors used as switches often have bad matching properties, particularly as the switching transistor size is often desired to be small for minimal parasitic capacitances and low charge injection. Accordingly, this additional series resistance 218 is larger than the on-resistance of the switches 40, 240, and is, therefore, the primary controlling factor in the RC time constant. This results in better matching and more consistent loading for the VCO 18, and, therefore, better prevention of output spurious signals.

Figure 15:
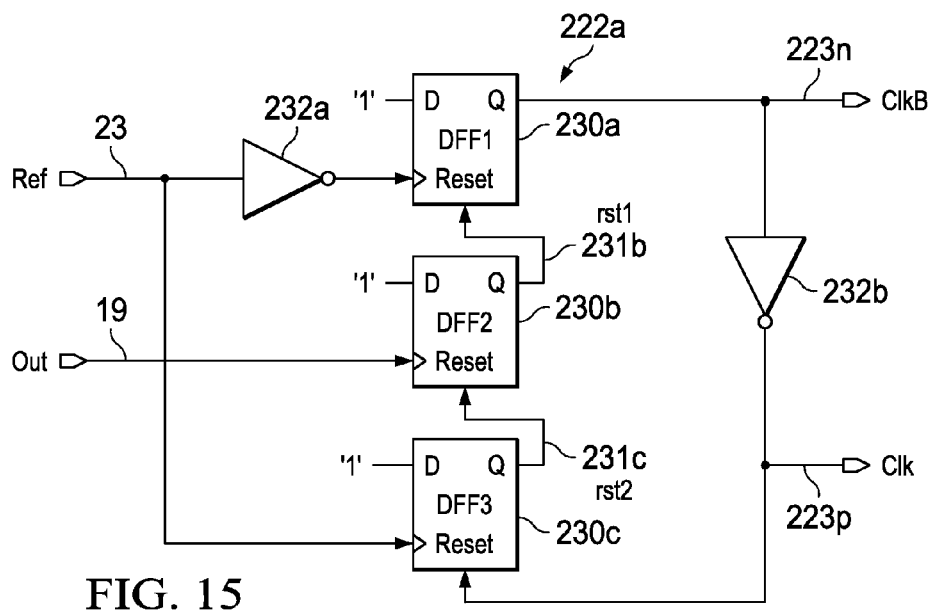
FIG. 15 is a schematic diagram of an exemplary embodiment of the sampling control circuitry of FIGS. 13 and 14.

Referring to FIG. 15, an exemplary embodiment 222a of the sampling control signal 222 is implemented using synchronous logic circuitry. In accordance with a preferred embodiment, this synchronous logic circuitry includes a plurality of D-type flip-flops 230a, 230b, 230c, plus logic inverters 232a, 232b. The data inputs D are tied high, while the Q outputs 231c, 231b, 223n serve as reset signals, with one Q output signal 223n serving as the complementary sampling control signal 223n, which is inverted to provide the primary sampling control signal 223p. The buffer reference signal 23 and VCO output signal 19 serve as clock signals for the flip-flops 230a, 230b, 230c, as shown.

Figure 16:
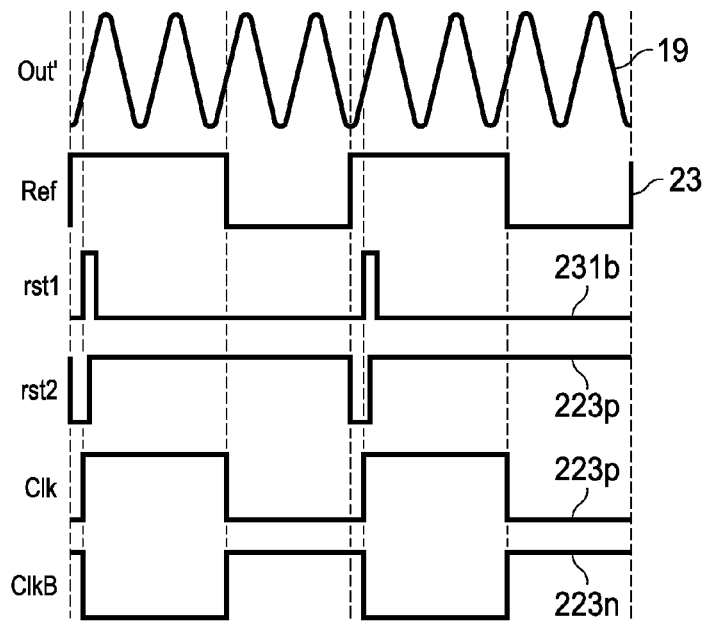
FIG. 16 is a signal timing diagram for the circuitry of FIG. 15.

Referring to FIG. 16, the relative phase relationships of the VCO output 19, buffered reference 23, reset 231b, 231c and switch control 223p, 223n signals are produced as a result of such signal interconnections. As discussed above, the switch control signals 223p, 223n are complementary and have asserted states with durations equal to an integer multiple of the period of the VCO output signal 19.

Figure 17:
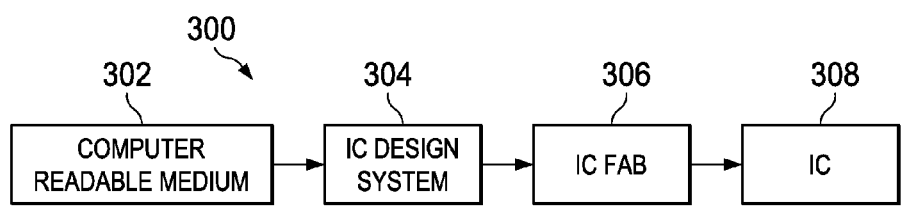
FIG. 17 is a functional block diagram of an exemplary embodiment of an integrated circuit design and fabrication system operated in accordance with computer instructions.

Referring to FIG. 17, integrated circuit (IC) design systems 304 (e.g., work stations with digital processors) are known that create integrated circuits based on executable instructions stored on a computer readable medium 302, e.g., including memory such as but not limited to CD-ROM, DVD-ROM, other forms of ROM, RAM, hard drives, distributed memory, or any other suitable computer readable medium. The instructions may be represented by any programming language, including without limitation hardware descriptor language (HDL) or other suitable programming languages. The computer readable medium contains the executable instructions (e.g., computer code) that, when executed by the IC design system 304 (e.g., by a work station or other form of computer), cause an IC fabrication system 306 to produce an IC 308 that includes the devices or circuitry as set forth herein. Accordingly, the devices or circuits described herein may be produced as ICs 308 by such IC design systems 304 executing such instructions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus, comprising:
   a sampling phase lock loop (PLL) circuit including first and second signal sampling circuitry, and configured to generate a PLL output signal with a PLL signal frequency and a corresponding PLL signal period, phase locked with a reference signal; and
   buffer circuitry responsive to the reference signal and a duty cycle control signal by providing first and second sampling control signals, said first sampling control signal having a duty cycle controlled by said duty cycle control signal and said second sampling control signal being the inverse of said first sampling control signal;
   wherein said second signal sampling circuitry is responsive to said second sampling control signal and said PLL output signal by providing said duty cycle control signal;
   wherein said first sampling circuitry is responsive to said first sampling control signal and said PLL output signal by providing a PLL control signal that controls generation of said PLL output signal.

2. The apparatus of claim 1, wherein:
   said first sampling control signal includes mutually opposed signal states; and
   at least one of said mutually opposed signal states has a duration substantially equal to an integer multiple of said PLL signal period.

3. The apparatus of claim 1, wherein:
   said second sampling control signal includes mutually opposed signal states; and
   at least one of said mutually opposed signal states has a duration substantially equal to an integer multiple of said PLL signal period.

4. The apparatus of claim 1, wherein said first signal sampling circuitry comprises first sampling phase detection circuitry responsive to said first sampling control signal by sampling said PLL output signal to provide a first sampled signal corresponding to the PLL control signal.

5. The apparatus of claim 4, wherein said second signal sampling circuitry comprises second sampling phase detection circuitry responsive to said second sampling control signal by sampling said PLL output signal to provide a second sampled signal corresponding to said duty cycle control signal.

6. The apparatus of claim 1,
   wherein the duty cycle of said first sampling control signal is defined by a sampling edge and a signal edge, the sampling edge and the signal edge defining a sampling duration;
   wherein said buffer circuitry comprises:
      signal pulse generator circuitry responsive to said reference signal and said duty cycle control signal by providing a pulsed signal; and
      signal conversion circuitry coupled to said signal pulse generator circuitry and responsive to said reference signal and said pulsed signal by providing said first and second sampling control signals such that the sampling duration of said first sampling control signal is substantially equal to an integer multiple of said PLL signal period.

7. The apparatus of claim 6:
   wherein said first signal sampling circuitry comprises first sampling phase detection circuitry responsive to said first sampling control signal by sampling said PLL output signal to provide a first sampled signal corresponding to said PLL control signal, such that said sampling PLL circuit is responsive to said PLL control signal to phase lock the PLL output signal to the sampling edge of said first sampling control signal;
   wherein said second signal sampling circuitry comprises a delay locked loop (DLL) circuit including second sampling phase detection circuitry responsive to said second sampling control signal (corresponding to the inverse of said first sampling control signal), by sampling said PLL output signal to provide a second sampled signal corresponding to said duty cycle control signal; and
   wherein said pulsed signal is defined by first and second transition edges, and wherein said pulse generator circuitry comprises:
      delay control circuitry configured to controllably delay the first transition edge in response to said duty cycle control signal; and
      pulse width control circuitry configured to establish the second transition edge such that said pulsed signal has a predetermined pulse width;
      such that the signal edge of the first sampling control signal provided by said signal conversion circuitry corresponds to the first transition edge of the pulsed signal,
   and such that said DLL circuit phase locks said PLL output signal to the sampling edge of said second sampling control signal, which corresponds to the signal edge of the first sampling control signal, thereby establishing the sampling duration of said first sampling control signal as substantially equal to an integer multiple of said PLL signal period.

8. A system, comprising:
a circuit configured to perform logic operations based on a PLL clock at a specified clock frequency;
a sampling phase lock loop (PLL) circuit including first and second signal sampling circuitry, and configured to generate a PLL output signal with a PLL signal frequency and a corresponding PLL signal period, phase locked with a reference signal; and
buffer circuitry responsive to the reference signal and a duty cycle control signal by providing first and second sampling control signals, said first sampling control signal having a duty cycle controlled by said duty cycle control signal and said second sampling control signal being the inverse of said first sampling control signal; and
wherein said second signal sampling circuitry is responsive to said second sampling control signal and said PLL output signal by providing said duty cycle control signal; and
wherein said first sampling circuitry is responsive to said first sampling control signal and said PLL output signal by providing a PLL control signal that controls generation of said PLL output signal.

9. The system of claim 8, wherein:
said first sampling control signal includes mutually opposed signal states; and
at least one of said mutually opposed signal states has a duration substantially equal to an integer multiple of said PLL signal period.

10. The system of claim 8, wherein said first signal sampling circuitry comprises first sampling phase detection circuitry responsive to said first sampling control signal by sampling said PLL output signal to provide a first sampled signal corresponding to said PLL control signal.

11. The system of claim 10, wherein said second signal sampling circuitry comprises second sampling phase detection circuitry responsive to said second sampling control signal by sampling said PLL output signal to provide a second sampled signal corresponding to said duty cycle control signal.

12. The system of claim 8,
wherein the duty cycle of said first sampling control signal is defined by a sampling edge and a signal edge, the sampling edge and the signal edge defining a sampling duration;
wherein said buffer circuitry comprises:
signal pulse generator circuitry responsive to said reference signal and said duty cycle control signal by providing a pulsed signal; and
signal conversion circuitry coupled to said signal pulse generator circuitry and responsive to said reference signal and said pulsed signal by providing said first and second sampling control signals such that said sampling duration is substantially equal to an integer multiple of said PLL signal period.

13. The system of claim 12:
wherein said first signal sampling circuitry comprises first sampling phase detection circuitry responsive to said first sampling control signal by sampling said PLL output signal to provide a first sampled signal corresponding to said PLL control signal, such that said sampling PLL circuit is responsive to said PLL control signal to phase lock the PLL output signal to the sampling edge of said first sampling control signal;
wherein said second signal sampling circuitry comprises a delay locked loop (DLL) circuit including second sampling phase detection circuitry responsive to said second sampling control signal (corresponding to the inverse of said first sampling control signal), by sampling said PLL output signal to provide a second sampled signal corresponding to said duty cycle control signal; and
wherein said pulsed signal is defined by first and second transition edges, and wherein said pulse generator circuitry comprises:
delay control circuitry configured to controllably delay the first transition edge in response to said duty cycle control signal; and
pulse width control circuitry configured to establish the second transition edge such that said pulsed signal has a predetermined pulse width;
such that the signal edge of the first sampling control signal provided by said signal conversion circuitry corresponds to the first transition edge of the pulsed signal,
and such that said DLL circuit phase locks said PLL output signal to the sampling edge of said second sampling control signal, which corresponds to the signal edge of the first sampling control signal, thereby establishing the sampling duration of said first sampling control signal as substantially equal to an integer multiple of said PLL signal period.

14. A method of controlling a sampling phase lock loop (PLL) circuit configured to generate a PLL output signal with a PLL signal frequency and a corresponding PLL signal period, phase locked with a reference signal, comprising:
generating in response to a duty cycle control signal and said reference signal, first and second sampling control signals, said first sampling control signal having a duty cycle controlled by said duty cycle control signal and said second sampling control signal being the inverse of said first sampling control signal;
sampling, in response to said second sampling control signal, said PLL output signal to provide said duty cycle control signal; and
sampling, in response to said first sampling control signal, said PLL output signal to provide a PLL control signal that controls generation of said PLL output signal.

15. The method of claim 14, wherein:
said first sampling control signal includes mutually opposed signal states; and
at least one of said mutually opposed signal states has a duration substantially equal to an integer multiple of said PLL signal period.

16. The method of claim 14, wherein said sampling PLL circuit includes first sampling phase detection circuitry configured for sampling, in response to said first sampling control signal, said PLL output signal to provide said PLL control signal that controls generation of said PLL output signal.

17. The method of claim 16, wherein said sampling PLL circuit includes second sampling phase detection circuitry configured for sampling, in response to said second sampling control signal, said PLL output signal to provide said duty cycle control signal.

18. The method of claim 14, wherein the duty cycle of said first sampling control signal is defined by a sampling edge and a signal edge, the sampling edge and the signal edge defining a sampling duration, and wherein generating the first sampling control signal comprises:
generating, in response to said reference signal and said duty cycle control signal, a pulsed signal; and
generating, in response to said reference signal and said pulsed signal, said first sampling control signal such that said sampling duration is substantially equal to an integer multiple of said PLL signal period.

19. The method of claim 14:
- wherein said sampling PLL circuit includes first sampling phase detection circuitry configured for sampling, in response to said first sampling control signal, said PLL output signal to provide said PLL control signal that controls generation of said PLL output signal to phase lock the PLL output signal to the sampling edge of said first sampling control signal;
- wherein said sampling PLL circuit includes a delay locked loop (DLL) circuit including second sampling phase detection circuitry configured for sampling, in response to said second sampling control signal, said PLL output signal to provide said duty cycle control signal; and
- wherein the duty cycle of said first sampling control signal is defined by a sampling edge and a signal edge, the sampling edge and the signal edge defining a sampling duration, and wherein generating the first sampling control signal comprises:
  - generating, responsive to said reference signal and said duty cycle control signal, a pulsed signal defined by first and second transition edges by means of (a) controllably delaying the first transition edge in response to said duty cycle control signal; and (b) establishing the second transition edge such that said pulsed signal has a predetermined pulse width;
  - generating, in response to said reference signal and said pulsed signal, said first sampling control signal such that the signal edge of the first sampling control signal corresponds to the first transition edge of the pulsed signal, and such that said sampling duration is substantially equal to an integer multiple of said PLL signal period;
- such that said DLL circuit phase locks said PLL output signal to the sampling edge of said second sampling control signal corresponding to the signal edge of the first sampling control signal, thereby establishing said sampling duration as substantially equal to an integer multiple of said PLL signal period.

* * * * *